United States Patent
Nicholson et al.

(10) Patent No.: US 7,355,491 B2
(45) Date of Patent: Apr. 8, 2008

(54) INTERCONNECTING A PORT OF A MICROWAVE CIRCUIT PACKAGE AND A MICROWAVE COMPONENT MOUNTED IN THE MICROWAVE CIRCUIT PACKAGE

(75) Inventors: Dean B. Nicholson, Windsor, CA (US); Reto Zingg, Santa Rosa, CA (US); Keith W. Howell, Santa Rosa, CA (US); Eric R. Ehlers, Santa Rosa, CA (US)

(73) Assignee: Avago Technologies Wireless IP Pte Ltd, Singapore (SG)

( * ) Notice: Subject to any disclaimer, the term of this patent is extended or adjusted under 35 U.S.C. 154(b) by 0 days.

(21) Appl. No.: 11/626,715

(22) Filed: Jan. 24, 2007

(65) Prior Publication Data

US 2007/0115075 A1    May 24, 2007

Related U.S. Application Data

(62) Division of application No. 10/950,131, filed on Sep. 24, 2004, now Pat. No. 7,187,249.

(51) Int. Cl.
*H01P 5/00* (2006.01)

(52) U.S. Cl. .................... 333/33; 333/246
(58) Field of Classification Search ............ 333/33, 333/246, 247, 260; 257/728
See application file for complete search history.

(56) References Cited

U.S. PATENT DOCUMENTS

| 4,626,805 A | 12/1986 | Jones |
| 4,686,492 A | 8/1987 | Grellmann |
| 5,832,598 A | 11/1998 | Greenman et al. |
| 6,072,211 A | 6/2000 | Miller |
| 6,294,966 B1 | 9/2001 | Huang et al. |

(Continued)

FOREIGN PATENT DOCUMENTS

| EP | 0718905 A1 | 6/1996 |
| JP | 09214212 A | 8/1997 |
| WO | WO 02/058149 A1 | 7/2002 |

OTHER PUBLICATIONS

Wolfgang Menzel, "Interconnecs and packaging of millimeter wave circuits," IEEE MTT-S Newsletter, No. 149, pp. 39-42 (Summer 1998).

(Continued)

*Primary Examiner*—Stephen E. Jones

(57) ABSTRACT

In one aspect, a signal path is described. The signal path has a nominal impedance over a specified bandwidth and interconnects a port of a microwave circuit package and a microwave component mounted in the microwave circuit package. The signal path includes an inductive transition and first and second capacitive structures. The inductive transition extends from a first point on the signal path to a second point on the signal path and has an excess impedance above the nominal impedance. The first and second capacitive structures respectively shunt the first and second points on the signal path to compensate the excess impedance of the inductive transition. The inductive transition and the first and second capacitive structures approximate a filter having an impedance substantially matching the nominal impedance over the specified bandwidth. In other aspects, a microwave circuit package that incorporates the above-described signal path and an interconnection method that includes forming the above-described signal path are described.

20 Claims, 8 Drawing Sheets

U.S. PATENT DOCUMENTS

| | | |
|---|---|---|
| 6,469,592 B2 | 10/2002 | Huang et al. |
| 6,646,521 B1 | 11/2003 | Huang |
| 6,759,742 B2 | 7/2004 | Budka |
| 2002/0097094 A1 | 7/2002 | Wang |
| 2002/0180014 A1 | 12/2002 | Philpot |
| 2003/0096447 A1 | 5/2003 | Lao et al. |
| 2003/0151133 A1 | 8/2003 | Kinayman et al. |

OTHER PUBLICATIONS

HEI Broadband, HEI Inc., "A DC to 50 GHz and beyond MMIC Carrier," Artech House Books (Sep. 2001).

H. Kanno et al., "Surface mountable liquid crystal polymer package with vertical via transition compensating wire inductance up to V-band," IEEE MTT-S Digest (Jun. 2003).

Centallax, "5-20 GHz MMIC Amplifier with integrated bias," http://www.centellax.com (Aug. 10, 2004).

Centallax, "UVDM40SC—DC to 40 GHz MMIC Medium Power Voltage Controlled Attenuator Data Sheet," http://www.centallax.com (2003).

George L. Matthael et al., "Microwave filters, impedance matchings networks and coupling structures," Artech Books, Dedham, MA pp. 98, 100, 360,361, 365 (1980).

INTERCONNECTING A PORT OF A MICROWAVE CIRCUIT PACKAGE AND A MICROWAVE COMPONENT MOUNTED IN THE MICROWAVE CIRCUIT PACKAGE

CROSS-REFERENCE TO RELATED APPLICATIONS

This application is a divisional of prior U.S. patent application No. 10/950,131, filed Sep. 24, 2004 now U.S. Pat. No. 7,187,249.

BACKGROUND

Microwave components are assembled into microwave circuit packages that provide convenient structures for handling, installing, and connecting the microwave components to external circuits on a printed circuit board. A microwave circuit package typically includes multiple layers of dielectric material (e.g., plastic or ceramic material) that support respective sets of high-frequency signal traces, direct-current (DC) signal traces, and ground traces. Traces on different dielectric material layers typically are interconnected by electrically conducting vias that extend through the dielectric material layers. Although other connection methods are possible, cost and compatibility considerations often dictate that the traces of a microwave circuit package be connected to the microwave components that are mounted in the microwave circuit package by bond wires.

In microwave circuits, a source is interconnected to a load (e.g., an integrated circuit chip) by a signal path that is modeled as a transmission line. In general, the source and the load are impedance-matched to the nominal impedance of the transmission line in order to minimize losses and reflections and achieve maximal power transfer from the source to the load. Any transition in the signal path (e.g., any change in the electrical or physical characteristics of the signal path) introduces discontinuities in the impedance of the signal path, causing signal reflections that degrade the integrity of the transmitted signal and that reduce the power transferred to the load. Signal vias and bond wires are transitions that behave as parasitic inductances that cause significant reflections and significant degradation in the transmitted signal integrity, especially at frequencies in the GHz range and higher.

Different methods have been proposed for compensating the parasitic inductances of signal vias and bond wires. In one approach, the series inductance of ball-grid-array (BGA) transitions is compensated by placing ground vias around the signal via to form a quasi-coaxial structure along the BGA transition that increases the shunt capacitance to ground. The diameters and the spacings between the signal and ground vias are adjusted to change the shunt capacitance to a level that approximately matches the impedance of the transition to the impedances of the other sections of the signal path. In another approach, the series inductance of a bond wire is compensated by adding excess capacitance to the end of the signal trace on the microwave circuit package that is connected to one end of the bond wire.

Microwave circuit interconnections that incorporate such approaches to compensation of inductive parasitics are capable of impedance-matching via and bond wire transitions to the nominal impedance of the signal path sufficiently to achieve reasonable performance (e.g., −15 dB return loss) over frequencies ranging from DC up to about 50 GHz. These approaches to the compensation of inductive transitions, however, cannot match the impedance of these transitions to the nominal impedance of the signal path with sufficient accuracy to achieve high performance signal transmission (e.g., −20 dB return loss or better) at frequencies at or above 20 GHz, which is required for instrumentation and high quality commercial applications.

SUMMARY

In one aspect, the invention features a signal path that has a nominal impedance over a specified bandwidth and that interconnects a port of a microwave circuit package and a microwave component mounted in the microwave circuit package. The signal path comprises an inductive transition and first and second capacitive structures. The inductive transition extends from a first point on the signal path to a second point on the signal path and has an excess impedance above the nominal impedance. The first and second capacitive structures respectively shunt the first and second points on the signal path to compensate the excess impedance of the inductive transition. The inductive transition and the first and second capacitive structures approximate a filter having an impedance substantially matching the nominal impedance over the specified bandwidth.

In another aspect, the invention features a microwave circuit package that incorporates the above-described signal path.

In another aspect, the invention features a method of interconnecting a port of a microwave circuit package and a microwave component mounted in the microwave circuit package that comprises forming the above-described signal path.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The microwave interconnection embodiments described in detail below compensate inductive transitions in a microwave signal path in ways that achieve high performance signal transmission (e.g., −20 dB return loss or better) at frequencies at or above 20 GHz, which is required for instrumentation and high quality commercial applications. This high performance can be achieved while still allowing a relatively thick package substrate through which the signal via extends and allowing relatively long (e.g., 0.4 mm or greater) bond wires to connect the transmission lines on the topside of the package to the integrated circuits or components in the package cavity.

Figure 1:
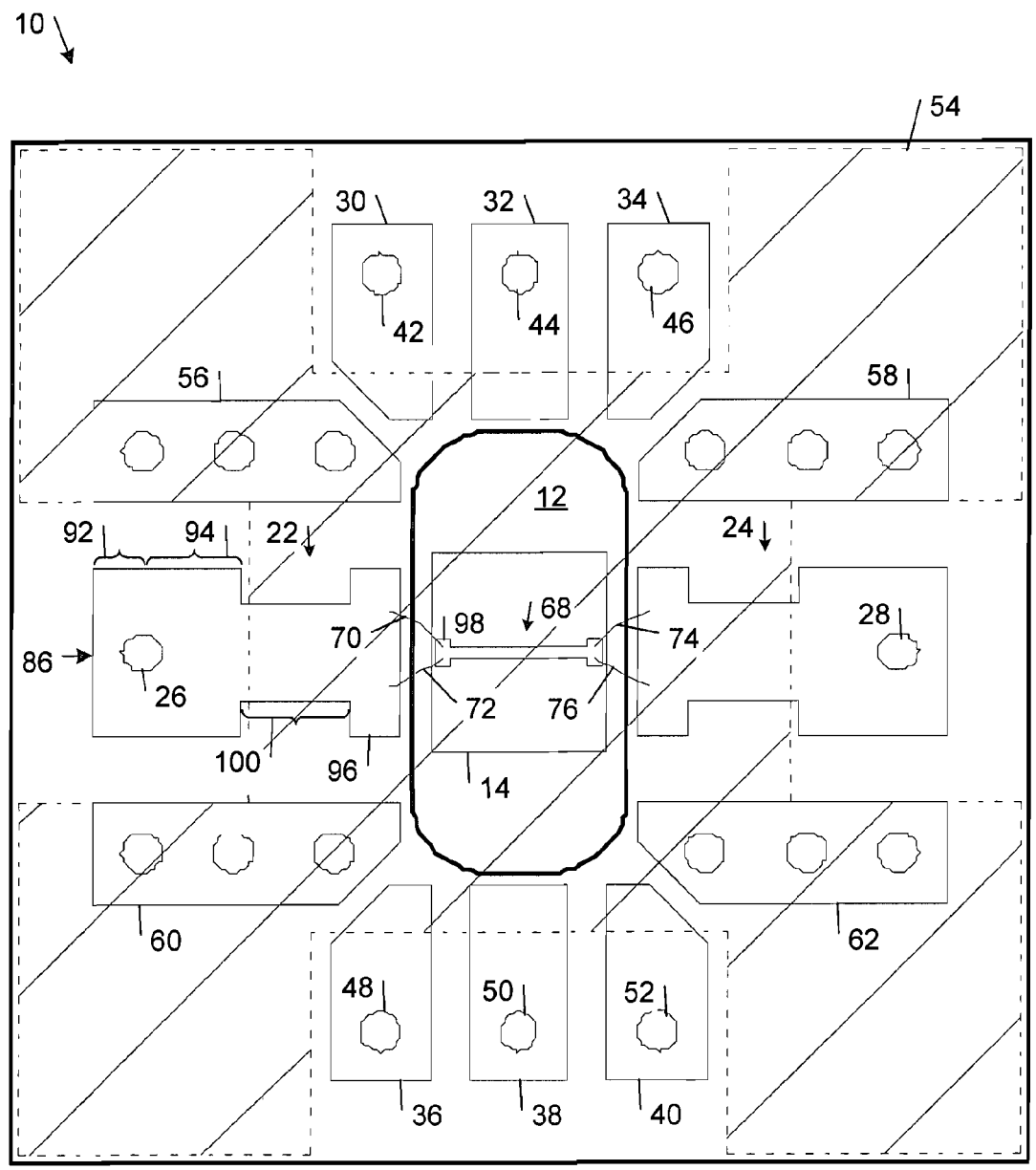
FIG. 1 is a top view of an embodiment of a microwave circuit package.
Figure 2:
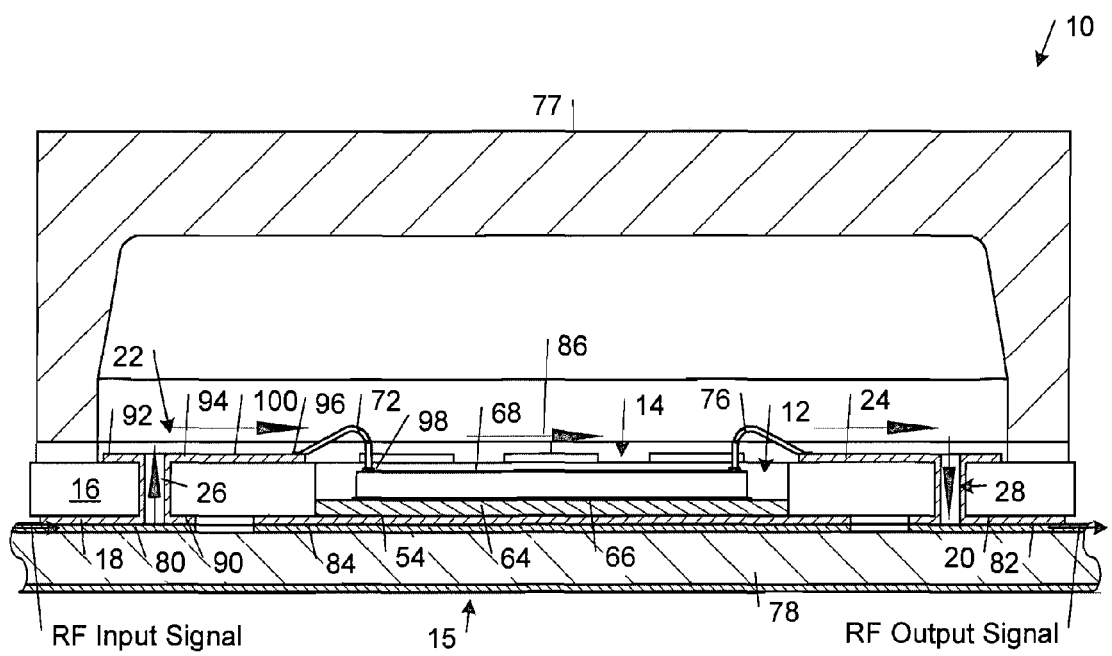
FIG. 2 is a cross-sectional view of the microwave circuit package of FIG. 1.

FIGS. 1 and 2 show top and cross-sectional views of an embodiment of a leadless SMT (surface mount technology) microwave circuit package 10 that includes a cavity 12 for connecting a microwave component 14 to a printed circuit board 15. In the illustrated embodiment, the cavity 12 contains a single microwave component 14 that corresponds to a microwave monolithic circuit (MMIC). In general, however, the cavity may contain one or more microwave components including, for example, MMICs, microwave transmission lines, microwave filters, and microwave attenuators.

The microwave circuit package 10 includes a dielectric substrate 16 supporting various topside and backside signal traces, topside and backside DC bias traces, and topside and backside ground plane traces. Among the signal traces and vias of the microwave circuit package 10 shown in FIGS. 1 and 2 are backside signal traces 18, 20, frontside signal traces 22, 24, and electrically conducting signal vias 26, 28. Among the DC bias traces and vias shown in FIGS. 1 and 2 are the topside DC bias traces 30-40 and their respective electrically conductive DC bias vias 42-52. Among the ground planes of the microwave circuit package 10 shown in FIGS. 1 and 2 are a backside ground plane 54 (shown by the hatched regions in FIG. 1) and the topside ground planes 56, 58, 60, 62. Each of the topside ground planes 56-62 is electrically connected to the backside ground plane 54 by a respective set of three electrically conductive vias shown in FIG. 1 by irregular circular shapes within the outlines of the topside ground planes 56-62.

The backside of the microwave component 14 is attached to a heat sink 64 within the cavity 12 by an adhesive 66 (e.g., silver epoxy). The heat sink 64, is a continuous vertical extension of the backside ground plane 54, that is created by plating the heat sink area more thickly with a thermally conductive material (e.g., a metal, such as copper) during the package manufacturing process. The top side of the microwave component 14 includes a signal trace 68 that is electrically connected to the topside signal traces 22, 24 of the microwave circuit package 10 by respective pairs of bond wires 70, 72 and 74, 76. In some embodiments, each of the bond wires has a length of at least 0.4 mm.

In one exemplary implementation, the substrate 16 of the microwave circuit package 10 is formed of a low loss dielectric material with dielectric constant of approximately 3.48, such as Rogers® 4350. A ceramic or plastic lid 77 is bonded to the substrate 16. The lid 77 covers the microwave component 14 and the topside features of the microwave circuit package 10. The topside and backside traces and ground planes of the microwave circuit package 10 are formed of gold-plated copper traces having a thickness of 40-80 micrometers (μm). The heat sink 64 is formed of gold plated on top of an approximately 25 μm thick layer of copper plating, with this approximately 25 μm thick copper plating layer becoming an integral part of the lower copper piece of the cavity 54 through the copper plating process. The vias are lined with gold-plated copper traces having a thickness of 17-25 μm.

The printed circuit board 15 includes a substrate 78 supporting inter alia topside signal traces 80, 82 and a topside ground plane 84. The backside signal traces, the backside DC traces, and the backside ground traces of the microwave circuit package 10 are bonded to the corresponding traces on the topside of the printed circuit board 15 using a leadless SMT mounting process.

FIGS. 1 and 2 show a signal path 86 that interconnects the backside signal traces 18, 20 of the microwave circuit package 10 to the topside signal traces 22, 24 and the signal trace 68 of the microwave component 14. In operation, an RF input signal is applied to the signal trace 80 on the printed circuit board 15. On the input side of the signal path 86, the RF input signal travels through the backside signal trace 18, the signal via 26, the topside signal trace 22, and over the pair of bond wires 70, 72 to the signal trace 68 of the microwave component 14. On the output side of the signal path 86, the RF output signal travels from the signal trace 68 of the microwave component 14, over the pair of bond wires 74, 76 to the signal trace 24, through the topside signal trace 24, the signal via 28, and the backside output signal trace 20. The RF output signal travels from the backside output signal trace 20 to the signal trace 82 on the printed circuit board 15.

In the illustrated embodiments, the input and output sides of the signal path 86 are mirror images of one another. For this reason, only the input side of the signal path 86 is described in detail below; this description applies to the output side of the signal path 86 in an analogous way.

In the following discussion, the signal path 86 is modeled as a transmission line having a nominal impedance over a specified bandwidth. In some implementations, the nominal impedance is 50 ohms and the specified bandwidth is DC to 40 GHz. On the input side of the signal path 86, the signal via 26 and the bond wire pair 70, 72 each correspond to an inductive transition that has an excess impedance above the nominal impedance of the signal path 86. As explained in detail below, capacitive structures that shunt the signal path at opposite ends of each of these inductive transitions are incorporated into the signal path to compensate the excess impedance of these inductive transitions. The inductive transitions and the compensating capacitive structures are designed to approximate a low-pass filter having an impedance substantially matching the nominal impedance over the specified bandwidth. Compensating both ends of each inductive transition achieves high performance signal transmission (e.g., −20 dB return loss or better) at frequencies at or above 20 GHz, which is required for instrumentation and high quality commercial applications.

With reference to FIGS. 1 and 2, the signal via 26 extends from a first point on the backside of the substrate 16 to a second point on the topside of the substrate 16. The parasitic inductance of the signal via 26 is compensated by shunting the first and second points with first and second capacitive structures. The first capacitive structure includes an open circuit transmission line stub 80 on the substrate 78 in parallel with the open circuit transmission line stub 90 on the package that taken together form a capacitance to ground with the various backside and topside grounds on the substrate 78 and the package 16. The second capacitive structure includes an open circuit transmission line stub 92, which forms a capacitor with the backside package ground 54, the topside package grounds 56 and 60, and to a lesser extent the topside grounds on the substrate 78. The width of section 94 of the topside signal trace 22 has been chosen such that its impedance is the nominal impedance of 50 ohms. The impedance of the transmission line section 100 also matches the nominal impedance of 50 ohms. The width of the transmission line section 100 is narrower than section 94 due to the presence of an underlying ground plane.

The bond wires 70, 72 extend from a third point at the end of the topside signal trace 22 of the microwave circuit package 10 to a fourth point at the end of the signal trace 68 on the microwave component 14. The parasitic inductance of the bond wires 70, 72 is compensated by shunting the third and fourth points with third and fourth capacitive structures. The third capacitive structure includes a bond pad portion 96 of the topside signal trace 22 that has a width larger than the width needed for a nominal impedance transmission line and that forms a capacitor with the underlying portion of the backside ground plane 54. In the embodiment of FIGS. 1 and 2, the third capacitive structure is connected to the second capacitive structure by a transmission line section 100 of the signal path 86 that has an impedance matching the nominal impedance. The fourth capacitive structure includes a bond pad portion 98 of the microwave component signal trace 68 that has a width larger than the width needed for a nominal impedance transmission line and that forms a capacitor with a ground plane on the backside of the microwave component.

Figure 3:
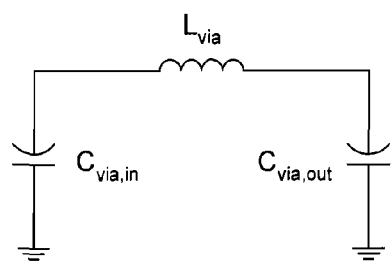
FIG. 3 is a circuit diagram of a lumped element model of an inductive transition corresponding to a signal via having first and second end points respectively shunted by first and second capacitive structures.
Figure 4:
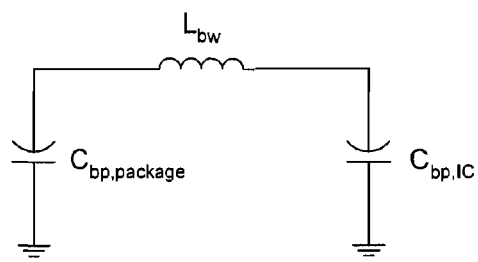
FIG. 4 is a circuit diagram of a lumped element model of an inductive transition corresponding to a bond wire having first and second end points respectively shunted by first and second capacitive structures.

Referring to FIGS. 3 and 4, the first and second capacitive structures are designed so that their capacitance values ($C_{via,in}$, $C_{via,out}$) and the inductance value ($L_{via}$) of the signal via 26 cooperatively form a first CLC filter having an impedance substantially matching the nominal impedance over the specified bandwidth. Similarly, the third and fourth capacitive structures are designed so that their capacitance values ($C_{bp,package}$, $C_{bp,IC}$) and the inductance value ($L_{bw}$) of the bond wires 70 and 72 form a second CLC low-pass filter having an impedance substantially matching the nominal impedance over the specified bandwidth. The capacitance values ($C_{via,in}$, $C_{via,out}$) and ($C_{bp,package}$, $C_{bp,IC}$) in each of the first and second low pass filter structures may be selected to optimize any type of nominal-impedance-matching low-pass filter structure including, for example, a Chebyshev low-pass filter, a Butterworth low-pass filter, and a Bessel low-pass filter. It has been observed that the impedance-matching performance of the double capacitive compensation approach shown in FIGS. 3 and 4 is improved by designing the compensating capacitive structures at the opposite ends of the inductive transition to have the same, or nearly the same, shunt capacitance value. In some implementations, these compensating capacitive structures have capacitance values within ±20% of each other. In some of these implementations, the compensating capacitive structures have the same capacitance values.

Figure 5:
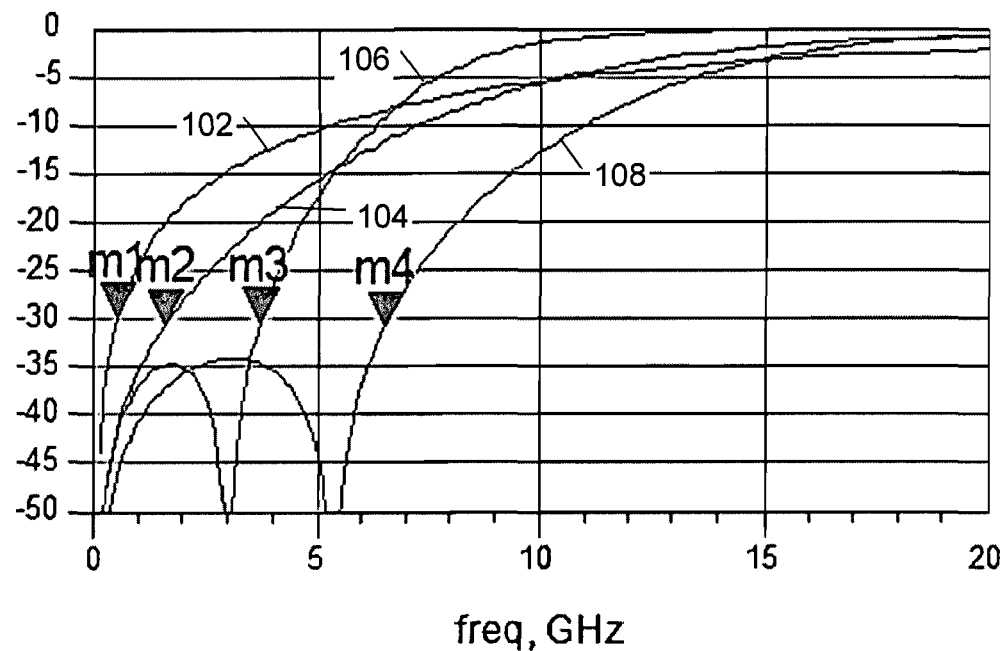
FIG. 5 shows graphs of return loss plotted as a function of frequency comparing an uncompensated parasitic inductance on the signal path to three different approaches to compensating parasitic inductances.

FIG. 5 shows graphs of the return loss as a function of frequency for different signal path structures. The first graph 102 shows the return loss for an uncompensated inductive transition modeled by a single 1 nH series inductor without any optimized compensating shunt capacitances. The second graph 104 shows the return loss for the same inductive transition compensated by a single optimized compensating shunt capacitance having a value of 0.3 pF. The third graph 106 shows the return loss for the same inductive transition incorporated into the optimized LCL filter structure shown in FIG. 6, where $L_1=L_2=1$ nH and $C_1=0.7$ pF. The fourth graph 108 shows the return loss for the same inductive transition compensated by a pair of optimized compensating shunt capacitors each of which has a capacitance value of 0.23 pF. This compensation approach corresponds to the CLC filters shown in circuit diagrams of FIGS. 3 and 4.

Figure 6:
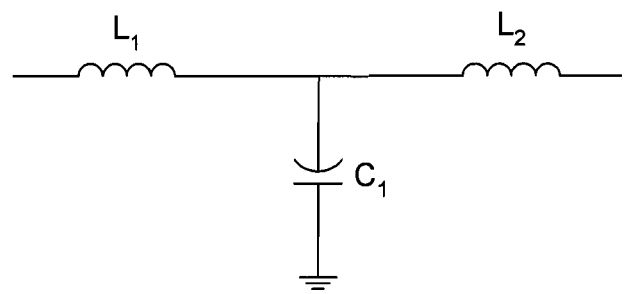
FIG. 6 is a circuit diagram of a lumped element model of an approach for compensating a parasitic inductance by incorporating it into an L-C-L low pass filter structure.

As shown in FIG. 5, the return loss performance achieved by compensating both ends of the inductive transition is superior to structures in which the inductive transition is uncompensated or is compensated at only one end, and is superior to the inductive compensation approach shown in FIG. 6. For example, with a −30 dB return loss specification, the uncompensated approach (M1) works up to a frequency of 500 MHz, the single capacitive compensation approach (M2) works up to a frequency of 1.6 GHz, the inductive compensation approach (M3) works up to a frequency of 3.7 GHz, and the double capacitive compensation approach (M4) works up to a frequency of 6.5 GHz.

Figure 7A:
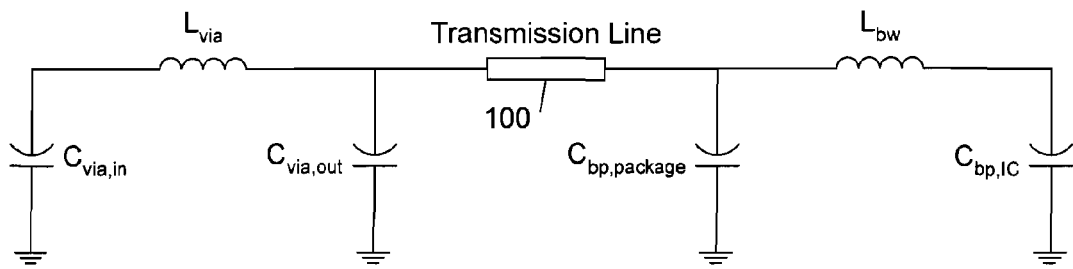
FIG. 7A is a circuit diagram of a lumped element model of the signal path shown in FIGS. 1 and 2 containing two C-L-C filter sections connected together by a transmission line section.
Figure 7B:
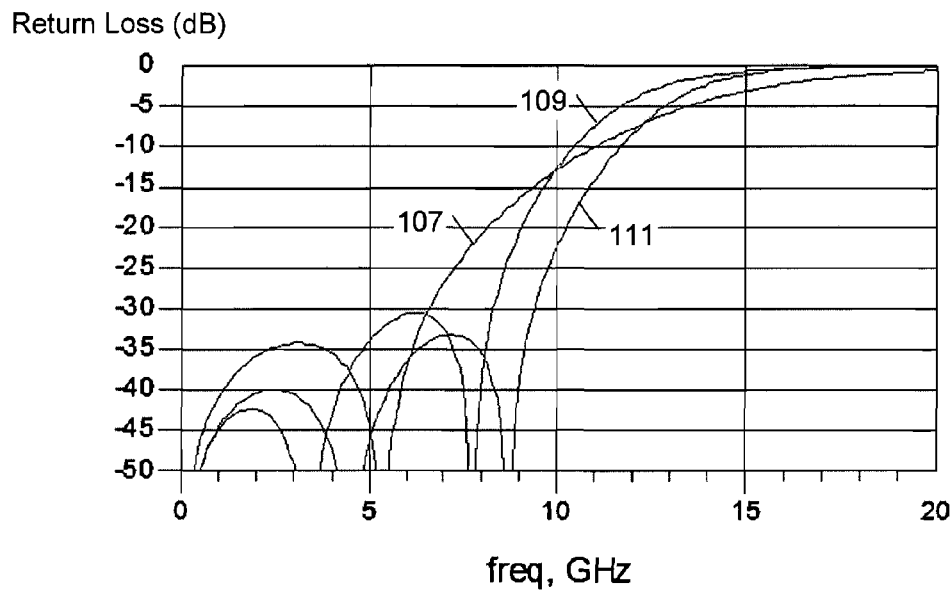
FIG. 7B shows graphs of return loss plotted as a function of frequency comparing different approaches to compensating parasitic inductive transitions, including the approach shown in FIG. 7A.

FIG. 7A shows a model of the signal path 86 in which the first and second CLC filters shown in FIGS. 3 and 4 are connected by the transmission line section 100, which has an impedance matching the nominal impedance. FIG. 7B shows graphs of return loss for different approaches for compensating the inductive transitions. The first graph 107 shows the return loss for a 1 nH inductive transition compensated by a pair of optimized compensating shunt capacitances with values of 0.23 pF, as shown in circuit diagrams of FIGS. 3 and 4. The second graph 109 shows the return loss for the two CLC filter sections and the joining transmission line section 100 shown in FIG. 7A, where each CLC filter section which includes a 1 nH inductive transition capacitively compensated by a pair of 0.21 pF capacitive structures. The third graph 111 shows the return loss for an optimized CLCLC filter corresponding to the embodiment of FIG. 8, in which the transmission line section 100 is removed and the capacitive structure at the topside of the signal via 26 and the capacitive structure at the bond pad portion 96 of the topside signal trace 22 are merged, as shown in FIG. 9A.

Based on simulations, it has been determined that the length of the transmission line section 100 has a significant impact on the performance of the signal path 86. In particular, if the transmission line 100 is large relative to the wavelength corresponding to the maximum frequency in the bandwidth specified for the signal path 86, the return loss performance deteriorates. It has been determined that by making the length of the transmission line section 100 equal to or less than about $1/10^{th}$ of a wavelength corresponding to the maximum frequency where the filter meets its return loss specification (i.e., 36 electrical degrees), the return loss performance of the signal path 86 is better than the performance of the standalone CLC filters shown in FIGS. 3 and 4. As shown in FIG. 7B, with a –30 dB return loss specification, the standalone CLC compensation approach works up to a frequency of 6.6 GHz, the approach shown in FIG. 7A with a transmission line length of 36 electrical degrees works up to a frequency of 8.5 GHz, and the optimized CLCLC compensation approach shown in FIGS. 8 and 9A works up to a frequency of 9.3 GHz.

Figure 8:
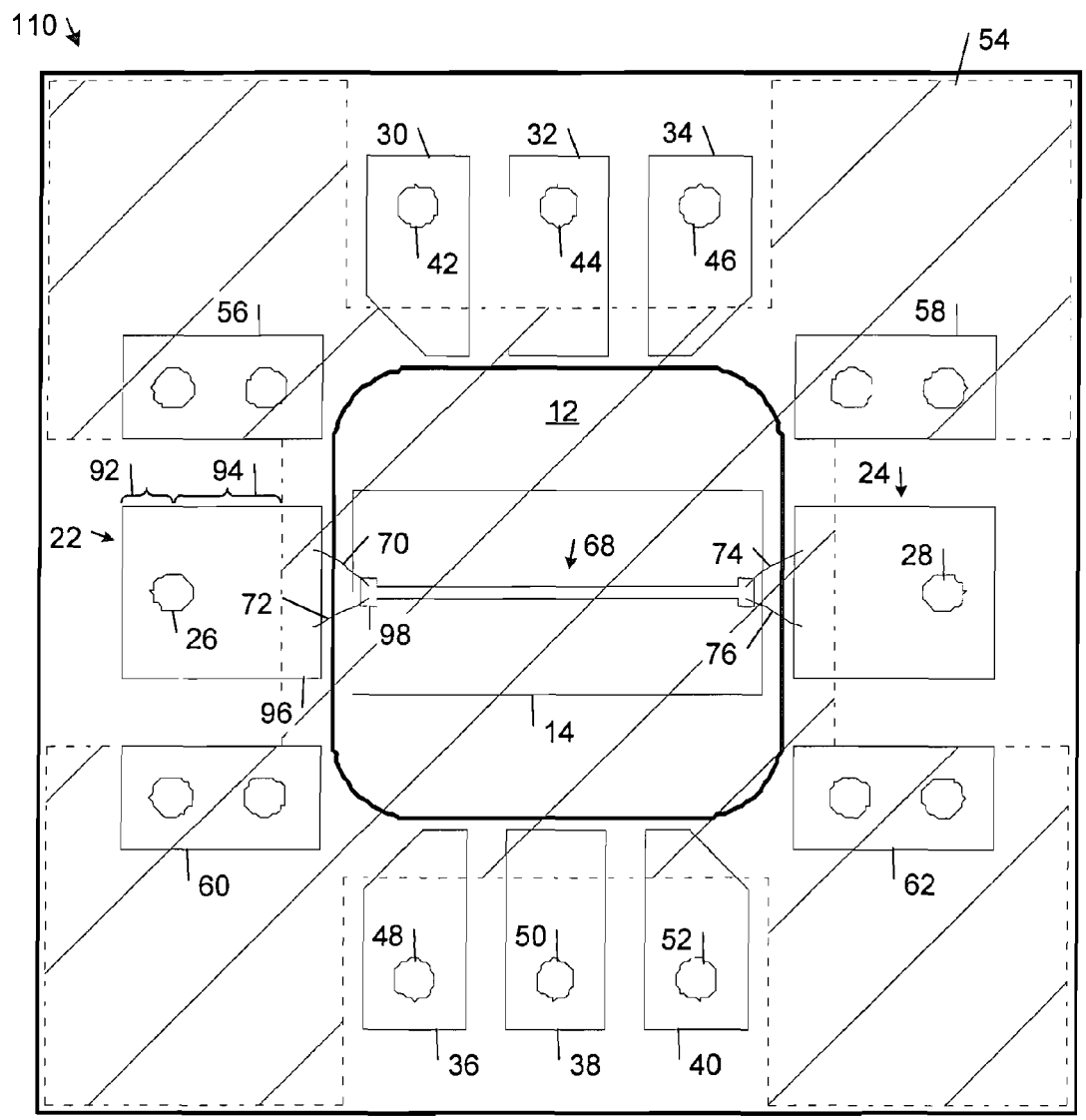
FIG. 8 is a top view of a second embodiment of a microwave circuit package.

FIG. 8 shows an embodiment of a microwave circuit package 110 that corresponds to the microwave circuit package 10 except that the topside transmission line section 100 of the topside signal trace 22 has been removed, leaving only the short section 94 of 50 ohm suspended substrate mode line connecting the capacitive portions 92 and 96 of the CLC low-pass filters. In this embodiment, the signal via 26 and the pair of bond wires 70, 72 are the same as the corresponding inductive transitions in the microwave circuit package 10. In addition, the capacitive structure at the backside end of the signal via 26 corresponds to the first capacitive structure in the microwave circuit package 10, and the capacitive structure at the bond pad end 98 of the signal trace 68 of the microwave component 14 corresponds to the fourth capacitive structure of the microwave circuit package 10.

Figure 9A:
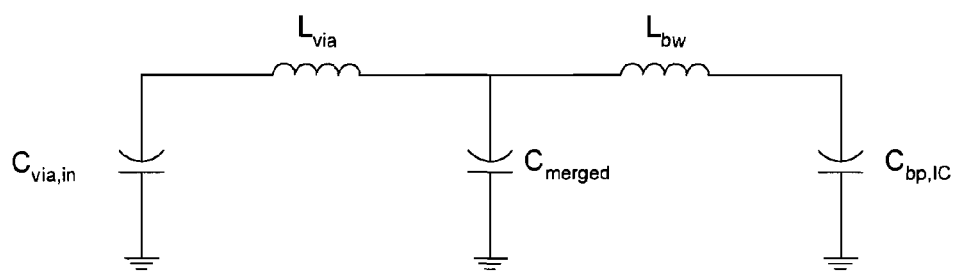
FIG. 9A is a circuit diagram of a lumped element model of the signal path shown in FIG. 8 containing two inductive transitions compensated by three capacitances in a C-L-C-L-C arrangement.

Referring to FIG. 9A, the capacitive structure at the input end of the signal via 26 ($C_{via,in}$), the signal via 26 ($L_{via}$), the merged capacitive structures ($C_{merged}$) shunting the topside signal trace 22, the pair of bond wires 70, 72 ($L_{bw}$), and the bond pad portion 98 ($C_{bp,IC}$) of the microwave component signal trace 68 cooperatively form a CLCLC filter that has an impedance substantially matching the nominal impedance over the specified bandwidth. The capacitance values ($C_{via,in}$, $C_{merged}$, and $C_{bp,IC}$) may be selected to optimize any type of nominal-impedance-matching low-pass filter structure including, for example, a Chebyshev low-pass filter, a Butterworth low-pass filter, and a Bessel low-pass filter.

Figure 9B:
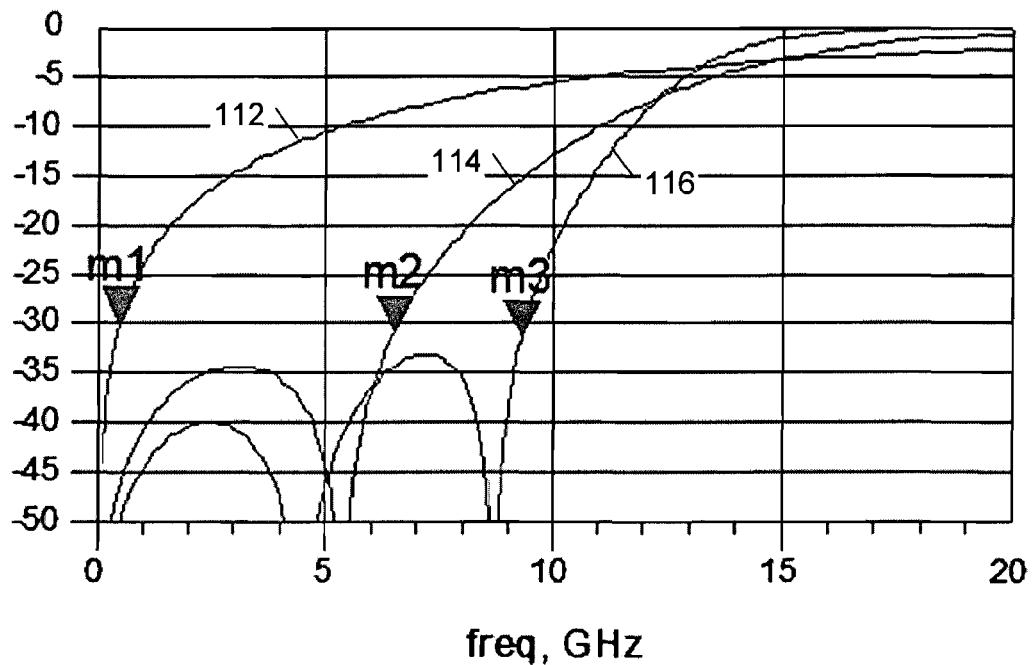
FIG. 9B shows graphs of return loss plotted as a function of frequency and comparing an uncompensated inductive transition, a single inductive transition compensated by two shunt capacitances, and two inductive transitions compensated by three shunt capacitances.

As shown in FIG. 9B, the capacitive compensation approach shown in FIGS. 8 and 9A has an improved impedance-matching performance relative to an uncompensated inductive transition and relative to the double capacitive compensation approach shown in FIGS. 3 and 4. In particular, the first graph 112 shows the return loss for an uncompensated inductive transition modeled by a single 1 nH series inductor without any optimized compensating shunt capacitances. The second graph 114 shows the return loss for the same inductive transition compensated by a pair of optimized compensating shunt capacitances with values of 0.23 pF, as shown in circuit diagrams of FIGS. 3 and 4. The third graph 116 shows the return loss for the capacitive compensation approach modeled in FIG. 9. With a –30 dB return loss specification, the uncompensated approach (M1) works up to a frequency of 500 MHz, the double capacitive compensation approach (M2) works up to a frequency of 6.5 GHz, and the compensation approach modeled in FIG. 9A (M3) works up to a frequency of 9.3 GHz.

Figure 10:
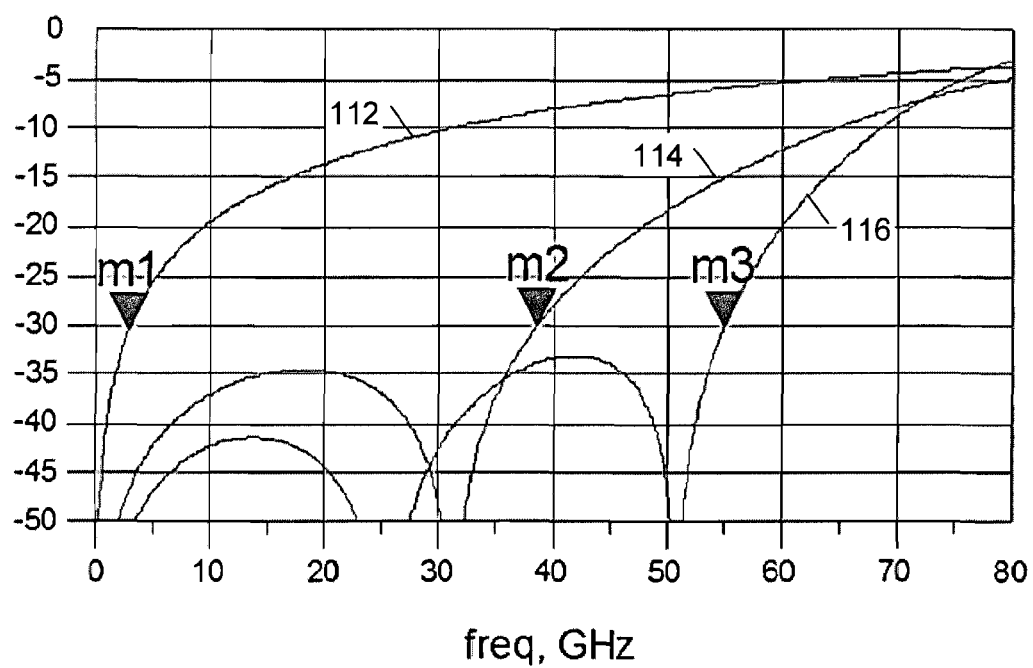
FIG. 10 shows graphs of return loss plotted as a function of frequency for the same compensation approaches as in FIG. 9B, except that the inductive transitions are modeled by 0.17 nH inductors instead of 1 nH inductors.

FIG. 10 shows graphs of return loss plotted as a function of frequency for the same compensation approaches as in FIG. 9A, except that the inductive transitions are modeled by 0.17 nH inductors instead of 1 nH inductors. Under these circumstances, with a –30 dB return loss specification, the uncompensated approach (M1) works up to a frequency of 2.8 GHz, the double capacitive compensation approach (M2) works up to a frequency of 38.6 GHz, and the compensation approach modeled in FIG. 8 (M3) works up to a frequency of 54.9 GHz. These graphs show the benefits of reducing the parasitic inductances of the signal via and bond wire transitions as much as possible.

Figure 11B:
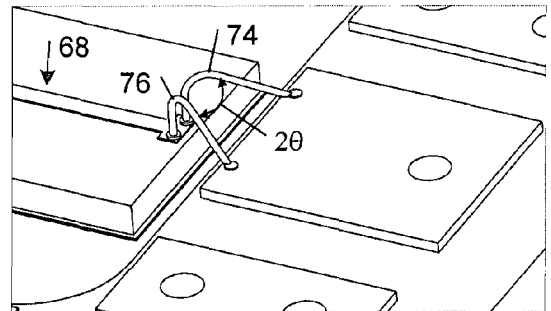
FIG. 11B is an enlarged perspective view of a bond wire portion of the microwave circuit package embodiment shown in FIG. 11A.
Figure 11A:
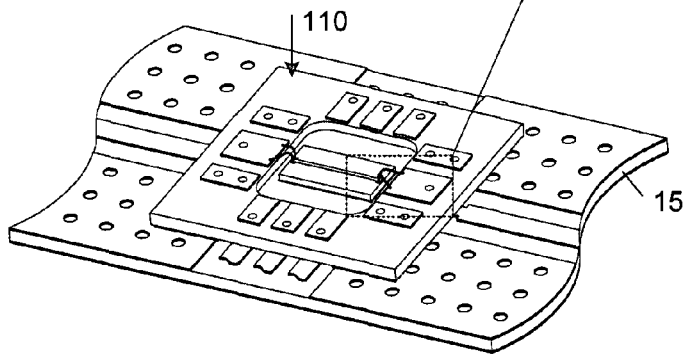
FIG. 11A is a perspective view of the microwave circuit package embodiment of FIG. 8 mounted on a printed circuit board.

FIG. 11A shows a perspective view of the microwave circuit package 110 mounted on the printed circuit board 15. FIG. 11B shows an enlarged view of the pair of bond wires 74, 76. The bond wires 74, 76 have respective projections onto a common plane that is substantially parallel to a top surface of the microwave component, where the projections are oriented with respect to each other at an angle at an angle $2\theta$, where $\theta$ is the angle that each of the bond wires makes with a line running down the center of and extending out from transmission line 68 shown in FIG. 11B. It has been observed that selecting the proper divergence angle $\theta$ between the bond wires minimizes the parasitic inductance of the inductive bond wire transition and, thereby, reduces the excess impedance of the inductive bond wire transition.

Figure 12:
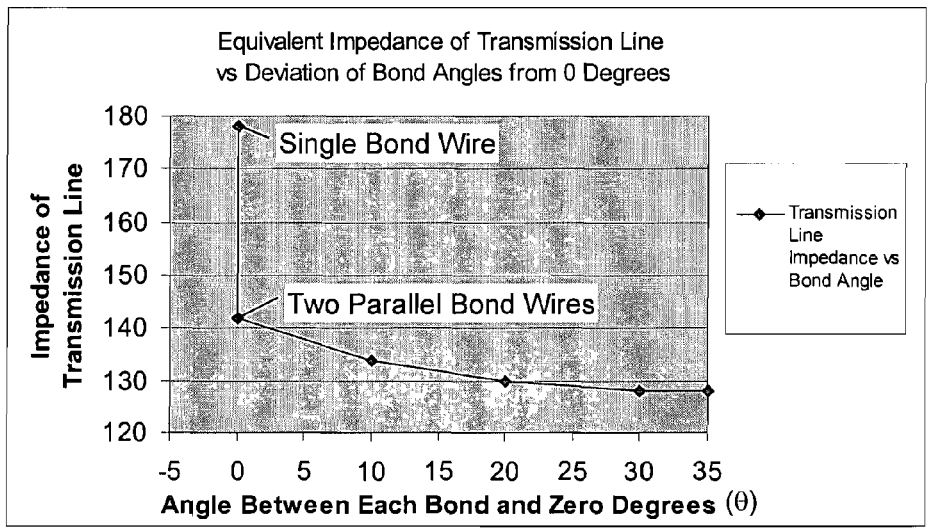
FIG. 12 shows the results of one set of simulations comparing the equivalent impedances of a single bond wire and a pair of bond wires diverging away from each other at an angle 2θ, where θ varies from 0° to 35° and 2θ varies from 0° to 70°.

In particular, FIG. 12 shows the results of one set of simulations comparing the equivalent impedances of a single bond wire and a pair of bond wires at divergence angles $\theta$ varying from 0° to 35°. Based on this simulation, selecting the divergence angle $\theta$ to be in the range of about 25° to about 35° (i.e., $2\theta$ is in the range of about 50° to about 70°) reduces the equivalent impedance of the bond wire pair by approximately 10% relative to the case in which the bond wires are parallel to one another. Thus, in some embodiments, the inductance of each bond wire transitions is reduced by bonding the bond wires 70, 72 and 74, 76 of each bond wire pair with angles of divergence in the range of about 25° to about 35°. In some embodiments, the inductance of the bond wire transitions are reduced by including more than two bond wires across transition between the circuit package and the microwave component 14.

Figure 13:
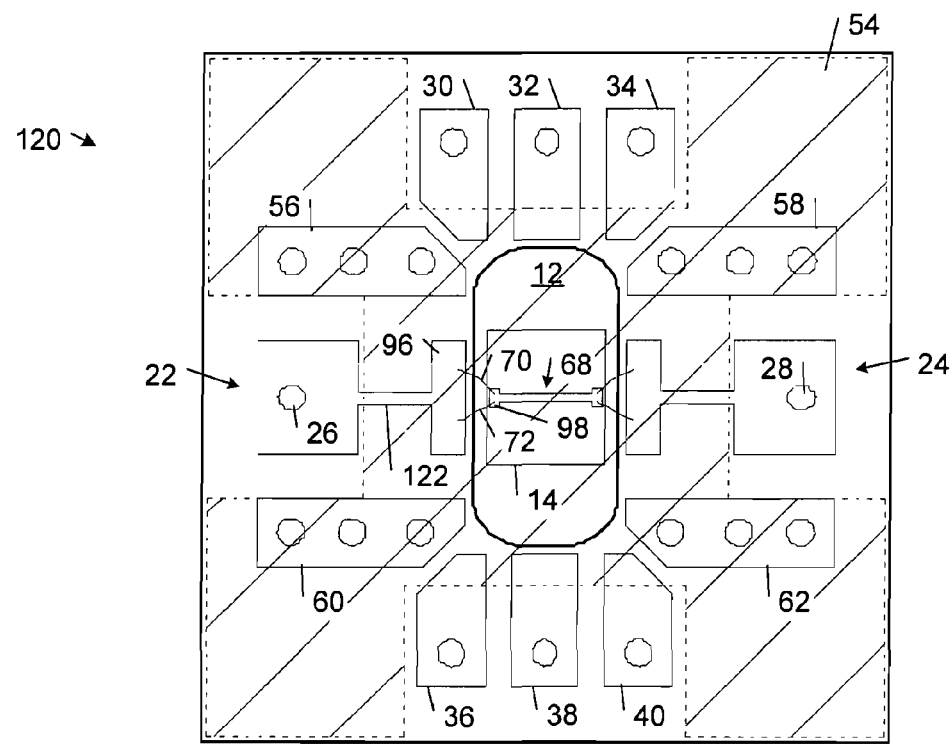
FIG. 13 is a top view of a third embodiment of a microwave circuit package.

Referring to FIG. 13, in a third embodiment, a microwave circuit package 120 corresponds to the microwave circuit package 10 except that the topside transmission line section 100 of the topside signal trace 22 has been replaced by a transmission line section 122 that has a width narrower than the width needed to match the nominal impedance, thereby making the transmission line section 122 behave as an inductor. In this embodiment, the signal via 26 and the pair of bond wires 70, 72 are the same as the corresponding inductive transitions in the microwave circuit package 10. In addition, microwave circuit package 120 includes the same four capacitive structures contained in the microwave circuit package 10.

Figure 14:
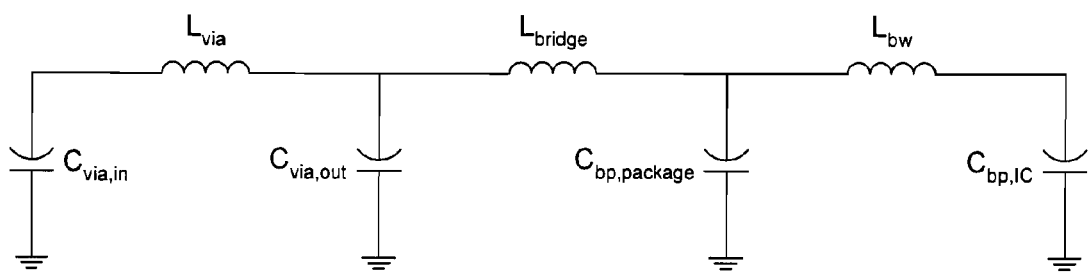
FIG. 14 is a circuit diagram of a lumped element model of the signal path shown in FIG. 13 containing three inductive transitions capacitively compensated by four shunt capacitances.

Referring to FIG. 14, the capacitive structures at the input and output ends of the signal via 26 ($C_{via,in}$, $C_{via,out}$), the signal via 26 ($L_{via}$), the inductive transmission line section 122 ($L_{bridge}$), the capacitive structure at the bond pad end of the topside signal trace 96 ($C_{bp,package}$) shunting the topside signal trace 22, the pair of bond wires 70, 72 ($L_{bw}$), and the bond pad portion 98 ($C_{bp,IC}$) of the microwave component signal trace 68 cooperatively form a CLCLCLC filter having an impedance substantially matching the nominal impedance over the specified bandwidth. The capacitance values ($C_{via,in}$, $C_{via,out}$, $C_{bp,package}$, and $C_{bp,IC}$) and the inductance value ($L_{bridge}$) of the transmission line section 122 may be selected to optimize any type of nominal-impedance-matching low-pass filter structure including, for example, a Chebyshev low-pass filter, a Butterworth low-pass filter, and a Bessel low-pass filter.

The impedance-matching performance of the capacitive compensation approach shown in FIGS. 13 and 14 is expected to be better (i.e., wider bandwidth for a given return loss specification) than the impedance-matching performances of the first and second embodiments described above.

Other embodiments are within the scope of the claims.

What is claimed is:

1. A signal path having a nominal impedance over a specified bandwidth and interconnecting a port of a microwave circuit package and a microwave component mounted in the microwave circuit package, the signal path comprising:
   a first inductive transition extending from a first point on the signal path to a second point on the signal path and having an excess impedance above the nominal impedance, wherein the first inductive transition comprises a signal via through at least one layer of the microwave circuit package, and the first and second points are on opposite ends of the signal via;
   a second inductive transition on the signal path and having an excess impedance above the nominal impedance;
   first and second capacitive structures respectively shunting the first and second points on the signal path; and
   a third capacitive structure shunting the signal path, wherein the first and second inductive transitions and the first, second and third capacitive structures approximate a CLCLC filter having an impedance substantially matching the nominal impedance over the specified bandwidth.

2. The signal path of claim 1, wherein the second inductive transition corresponds to a bond wire extending from a third point on the microwave circuit package to a fourth point on the microwave component, and the third capacitive structure comprises a capacitive bond pad section of the signal path shunting the fourth point on the microwave component.

3. The signal path of claim 1, wherein the microwave component is one of an integrated circuit chip, a transmission line, a filter, and an attenuator.

4. The signal path of claim 1, wherein the first, second, and third capacitive structures respectively shunt the signal path to ground.

5. The signal path of claim 1, further comprising a third inductive transition on the signal path and a fourth capacitive structure shunting the signal path, wherein the first, second and third inductive transitions and the first, second, third and fourth capacitive structures approximate a CLCLCLC filter having an impedance substantially matching the nominal impedance over the specified bandwidth.

6. The signal path of claim 5, wherein the second inductive transition corresponds to an inductive trace section of the signal path, and the third inductive transition corresponds to at least one bond wire.

7. The signal path of claim 6, wherein the second inductive transition has a length of approximately 36 electrical degrees or less.

8. A microwave circuit package, comprising:
   a signal path having a nominal impedance over a specified bandwidth;
   a first inductive transition extending from a first point on the signal path to a second point on the signal path and having an excess impedance above the nominal impedance; and
   a second inductive transition extending along the signal path and having an excess impedance above the nominal impedance;
   first and second capacitive structures respectively shunting the first and second points on the signal path; and
   a third capacitive structure shunting the signal path;
   wherein the first and second inductive transitions and the first, second and third capacitive structures approximate a CLCLC filter having an impedance substantially matching the nominal impedance over the specified bandwidth.

9. The microwave circuit package of claim 8, wherein the first inductive transition comprises a signal via through at least one layer of the microwave circuit package, and the first and second points are on opposite ends of the signal via.

10. The microwave circuit package of claim 8, further comprising a port and a microwave component mounted in the microwave circuit package, wherein the signal path interconnects the port and the microwave component, the first point is on the microwave circuit package and the second point is on the microwave component, and the first inductive transition comprises at least one bond wire extending from the first point to the second point.

11. The microwave circuit package of claim 8, further comprising a leadless surface mount package frame supporting at least a portion of the signal path.

12. The microwave circuit package of claim 1, wherein the second inductive transition corresponds to a bond wire extending from a third point on the microwave circuit package to a fourth point on the microwave component, and the third capacitive structure comprises a capacitive bond pad section of the signal path shunting the fourth point on the microwave component.

13. The microwave circuit package of claim 8, wherein the first, second, and third capacitive structures respectively shunt the signal path to ground.

14. The microwave circuit package of claim 8, further comprising a third inductive transition on the signal path and a fourth capacitive structure shunting the signal path, wherein the first, second and third inductive transitions and the first, second, third and fourth capacitive structures approximate a CLCLCLC filter having an impedance substantially matching the nominal impedance over the specified bandwidth.

15. The microwave circuit package of claim 14, wherein the second inductive transition corresponds to an inductive trace section of the signal path, and the third inductive transition corresponds to at least one bond wire.

16. The microwave circuit package of claim 15, wherein the second inductive transition has a length of approximately 36 electrical degrees or less.

17. A method of interconnecting a port of a microwave circuit package and a microwave component mounted in the microwave circuit package, comprising:
   forming a signal path having a nominal impedance over a specified bandwidth, wherein forming the signal path comprises forming a first inductive transition extending from a first point on the signal path to a second point on the signal path and having an excess impedance above the nominal impedance, forming a second inductive transition extending along the signal path and having an excess impedance above the nominal impedance, and compensating the excess impedance of the first and second inductive transitions with first, second, and third capacitive structures respectively shunting the signal path, wherein the first and second inductive transitions and the first, second, and third capacitive structures approximate a CLCLC filter having an impedance substantially matching the nominal impedance over the specified bandwidth.

18. The method of claim 17, wherein the first, second, and third capacitive structures respectively shunt the signal path to ground.

19. The method of claim 17, wherein the second inductive transition corresponds to a bond wire extending from a third point on the microwave circuit package to a fourth point on the microwave component, and the third capacitive structure comprises a capacitive bond pad section of the signal path shunting the fourth point on the microwave component.

20. The method of claim 17, further comprising forming a third inductive transition extending along the signal path and forming a fourth capacitive structure shunting the signal path, wherein the first, second, and third inductive transitions and the first, second, third, and fourth capacitive structures approximate a CLCLCLC filter having an impedance substantially matching the nominal impedance over the specified bandwidth.

* * * * *